(12) United States Patent
Jang et al.

(10) Patent No.: US 6,979,616 B2
(45) Date of Patent: Dec. 27, 2005

(54) METHOD FOR FABRICATING SEMICONDUCTOR DEVICE WITH DUAL GATE DIELECTRIC STRUCTURE

(75) Inventors: Se-Aug Jang, Ichon-shi (KR); Heung-Jae Cho, Ichon-shi (KR); Kwan-Yong Lim, Ichon-shi (KR); Hyo-Geun Yoon, Ichon-shi (KR); Seok-Kiu Lee, Ichon-shi (KR); Hyun-Chul Sohn, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/878,346

(22) Filed: Jun. 29, 2004

(65) Prior Publication Data

US 2005/0136593 A1      Jun. 23, 2005

(30) Foreign Application Priority Data

Dec. 19, 2003    (KR) ...................... 10-2003-0093887

(51) Int. Cl.$^7$ .......................................... H01L 21/336
(52) U.S. Cl. ................. 438/257; 438/551; 438/745
(58) Field of Search ............... 438/257, 451, 438/551, 622, 652, 745

(56) References Cited

U.S. PATENT DOCUMENTS 5,061,654 A * 10/1991 Shimizu et al. ............. 438/451
6,844,589 B2 * 1/2005 Kim ............................ 257/324

FOREIGN PATENT DOCUMENTS

KR    2001-100005    11/2001

OTHER PUBLICATIONS

Notice of Preliminary Rejection from Korean Intellectual Property Office dated Jul. 22, 2005, for Korean Application No. 2003-93887.

* cited by examiner

Primary Examiner—Phuc T. Dang
(74) Attorney, Agent, or Firm—Finnegan, Henderson, Farabow, Garrett, & Dunner, L.L.P.

(57)    ABSTRACT

Disclosed is a method for fabricating a semiconductor device with a dual gate dielectric structure. The method includes the steps of: sequentially forming a first oxide layer, a nitride layer and a second oxide layer on a substrate provided with a cell region for the NVDRAM and a peripheral circuit region for a logic circuit; forming a mask on the cell region; performing a first wet etching process by using the mask as an etch barrier to remove the second oxide layer formed in the peripheral circuit region; performing a second wet etching process by using the second oxide layer remaining in the cell region as an etch barrier to remove the nitride layer formed in the peripheral circuit region; forming a third oxide layer on the first oxide layer remaining in the peripheral circuit region; and forming a gate electrode on the second oxide layer and the third oxide layer.

11 Claims, 5 Drawing Sheets

METHOD FOR FABRICATING SEMICONDUCTOR DEVICE WITH DUAL GATE DIELECTRIC STRUCTURE

FIELD OF THE INVENTION

The present invention relates to a method for fabricating a semiconductor device; and, more particularly, to a method for fabricating a semiconductor device with a dual gate dielectric structure.

DESCRIPTION OF RELATED ARTS

Generally, stored data in a dynamic random access memory (DRAM) device are lost if the power is not supplied. That is, in a DRAM device, a transistor serves as a switcher; a capacitor serves as a data storage unit. Thus, the DRAM device is a volatile memory in which stored data are automatically lost when the power is removed.

To overcome this disadvantage of the DRAM device, there has been a vigorous study on a non-volatile DRAM (NVDRAM) device fabricated by combining a high-speed writing function of the DRAM device with a non-volatile characteristic of a flash memory.

That is, the NVDRAM device is developed such that a transistor has a storage function. Thus, when the power is not supplied to the NVDRAM device, data stored in a capacitor is set to be stored in the transistor, thereby obtaining a non-volatile characteristic as like a flash memory. Conversely, when the power is supplied again to the NVDRAM device, data stored in the transistor is stored again into the capacitor, thereby operating the original DRAM function.

Since the NVDRAM device has combined characteristics of a high-speed writing function provided from the DRAM device and a high-speed reading function and a non-volatile characteristic provided from the flash memory, the NVDRAM device will be diversely applicable in various fields such as mobile terminals, personal digital assistants (PDAs), system-on-chips (SOCs) and the like.

In such a NVDRAM device, a gate dielectric structure having a characteristic corresponding to the non-volatile characteristic of the NVDRAM device is formed in a cell region. On the other hand, a typical gate dielectric structure is formed in a peripheral circuit region.

FIG. 1 is a cross-sectional view of a conventional NVDRAM device defined with a cell region and a peripheral circuit region. In the cell region, a gate dielectric structure is formed in multi-layers of silicon, oxide, nitride, oxide, and silicon (SONOS). In the peripheral circuit region, the gate dielectric structure is formed in a single oxide layer.

More specifically, a substrate 11 made of silicon is divided into the cell region and the peripheral circuit region. In the peripheral circuit region, a single oxide layer 15 is formed on the substrate 11, thereby forming a gate dielectric structure. In the cell region, a first oxide layer 12, a nitride layer 13 and a second oxide layer 14 are sequentially formed on the substrate 11, thereby forming a gate dielectric structure.

Also, a gate polysilicon layer 16 for forming a gate electrode is formed on the gate dielectric structures in each of the cell region and the peripheral circuit region. Thus, in the cell region in which the NVDRAM device is formed, the gate dielectric structure eventually has a form of the SONOS obtained by sequentially stacking the gate polysilicon layer 16, the second oxide layer 14, the nitride layer 13, the first oxide layer 12 and the silicon-based substrate 11.

In the NVDRAM device with the gate dielectric structure as above, a direct tunneling effect, obtained through the first oxide layer 12 disposed beneath the nitride layer 13, is used to realize such characteristics as a low voltage, a low power consumption and a high-speed operation. Also, when the power is removed, data are stored in the nitride layer 13 of the gate dielectric structure, thereby providing a non-volatile characteristic.

With references to FIGS. 2A to 2C, a conventional method for forming gate dielectric structures in a cell region and a peripheral circuit region will be described in detail.

FIGS. 2A to 2C are cross-sectional views describing a conventional method for forming gate dielectric structures.

Referring to FIG. 2A, a first oxide layer 22, a nitride layer 23 and a second oxide layer 24 are formed on a substrate 21 divided into a cell region and a peripheral circuit region.

Referring to FIG. 2B, a photosensitive pattern 25 is formed only on a region designated for a gate dielectric structure having a form of SONOS. That is, this region is the cell region in which an NVDRAM device will be formed.

Referring to FIG. 2C, a dry etching process is performed to remove the second oxide layer 24 and the nitride layer 23 in the peripheral circuit region. Thereafter, the photosensitive pattern 25 is removed.

As shown in FIG. 2C, in the cell region designated for the NVDRAM device, there is formed the gate dielectric structure including the first oxide layer 22, the nitride layer 23 and the second oxide layer 24. On the other hand, in the peripheral circuit region, there is the gate dielectric structure including only the first oxide layer 22.

However, the dry etching process may induce damages to the first oxide layer 22 in the peripheral circuit region because of a different etch selectivity between the nitride layer and the oxide layer. Also, a plasma used in the dry etching process may cause the SONOS gate dielectric structure in the cell region to be deteriorated, thereby further resulting in degraded reliability of the gate dielectric structure.

SUMMARY OF THE INVENTION

It is, therefore, an object of the present invention to provide a method for fabricating a semiconductor device with a dual gate dielectric structure by employing a wet etching process to thereby prevent incidences of damage to a dual gate dielectric structure occurring during a dry etching process and degradation of reliability of the gate dielectric structure.

In accordance with an aspect of the present invention, there is provided a method for fabricating a semiconductor device with a dual gate dielectric structure applied to a non-volatile dynamic random access memory (NVDRAM), including the steps of: sequentially forming a first oxide layer, a nitride layer and a second oxide layer on a substrate provided with a cell region for the NVDRAM and a peripheral circuit region for a logic circuit; forming a mask on the cell region; performing a first wet etching process by using the mask as an etch barrier to remove the second oxide layer formed in the peripheral circuit region; performing a second wet etching process by using the second oxide layer remaining in the cell region as an etch barrier to remove the nitride layer formed in the peripheral circuit region; forming a third oxide layer on the first oxide layer remaining in the peripheral circuit region; and forming a gate electrode on the second oxide layer and the third oxide layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device with a dual gate dielectric structure in accordance with a preferred embodiment of the present invention will be described in detail with reference to the accompanying drawings, which is set forth hereinafter.

FIGS. 3A to 3G are cross-sectional views illustrating a method for forming a dual gate dielectric structure in a semiconductor device in accordance with a preferred embodiment of the present invention.

Figure 1:
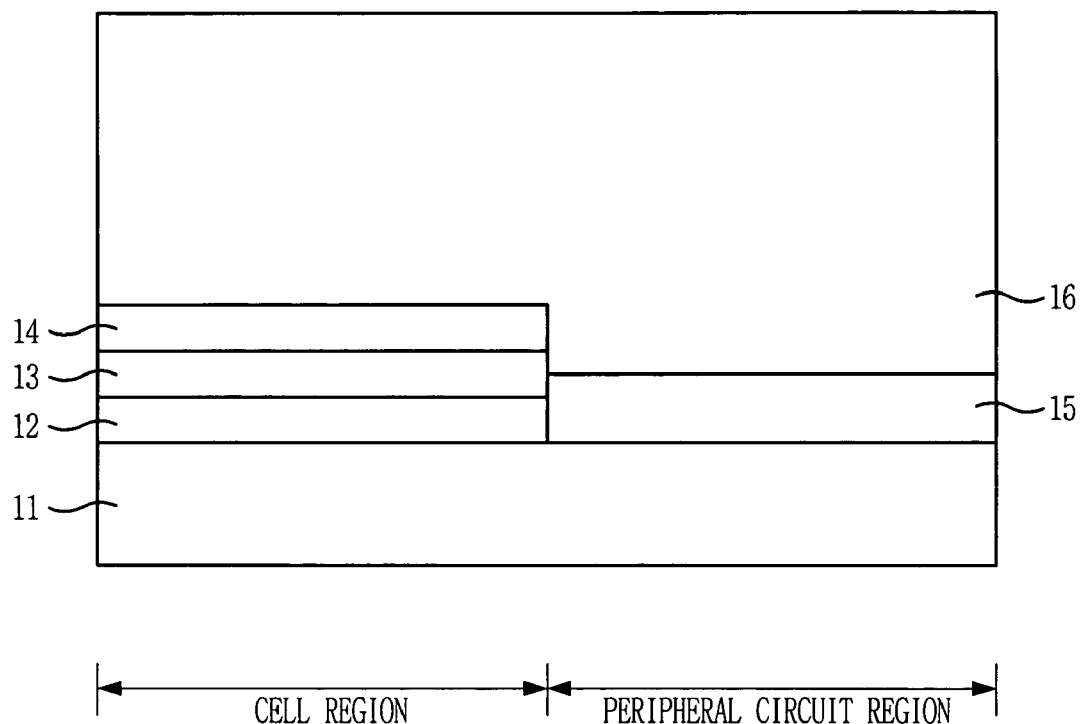
FIG. 1 is a cross-sectional view of a conventional NVDRAM device with a dual gate dielectric structure.
Figure 2A:
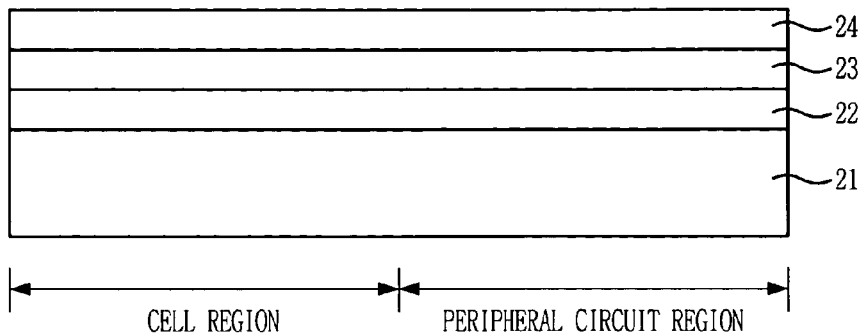
FIGS. 2A to 2C are cross-sectional views describing a conventional method for forming a gate dielectric structure.
Figure 2B:
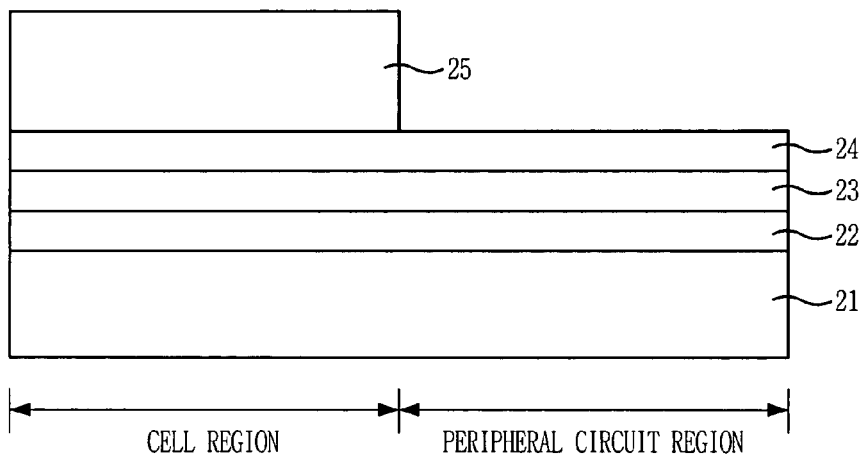
Figure 2C:
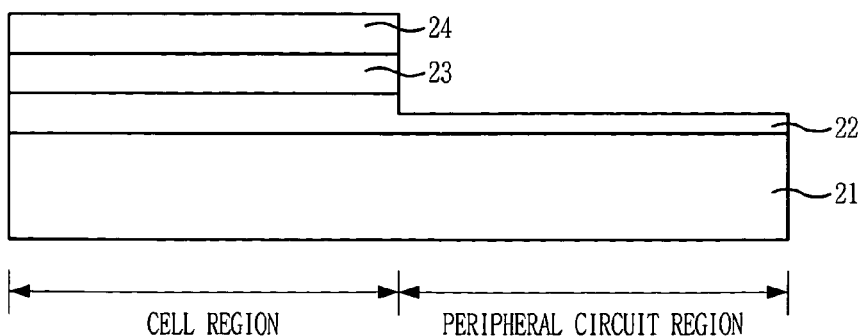
Figure 3A:
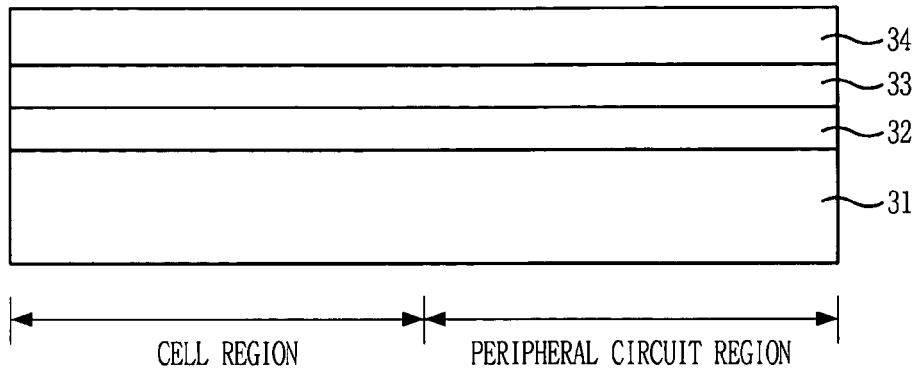
FIGS. 3A to 3G are cross-sectional views for forming a dual gate dielectric structure in a semiconductor device in accordance with a preferred embodiment of the present invention.

Referring to FIG. 3A, a first oxide layer 32 is formed on a substrate 31 divided into a cell region in which a non-volatile dynamic random access memory (NVDRAM) device will be formed and a peripheral circuit region in which a general logic circuit will be formed. At this time, a thermal oxidation method is used to form the first oxide layer 32 having a thickness ranging from approximately 10 Å to approximately 30 Å.

Then, a nitride layer 33 made of a nitride-based material such as silicon nitride ($Si_3N_4$) is formed on the first oxide layer 32. At this time, a thickness of the nitride layer 33 is in a range from approximately 20 Å to approximately 50 Å. Afterwards, a second oxide layer 34 is formed on the nitride layer 33 by employing a chemical vapor deposition (CVD) method. Herein, the second oxide layer 34 has a thickness ranging from approximately 30 Å to approximately 50 Å.

Figure 3B:
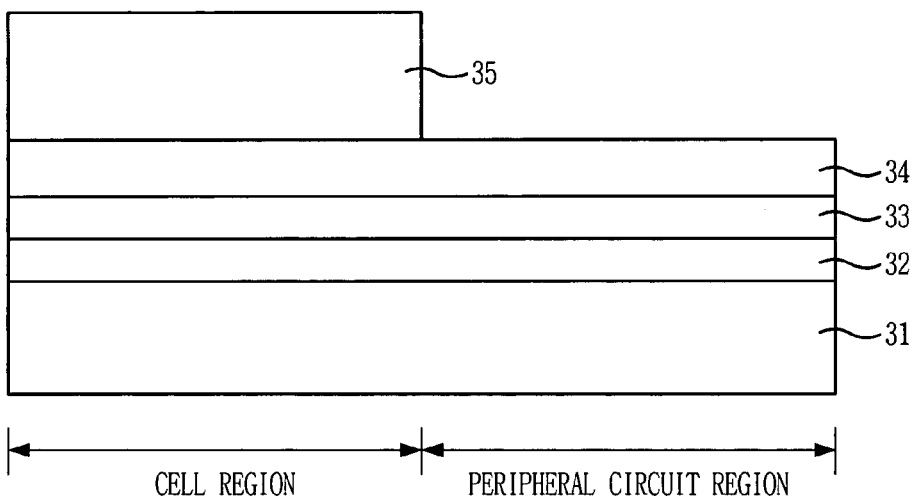

Referring to FIG. 3B, a photosensitive pattern 35 is formed on a predetermined region. Specifically, the photosensitive pattern 35 masks only the cell region in which a gate dielectric structure, obtained by sequentially stacking multi-layers of silicon/oxide/nitride/oxide/silicon (SONOS), will be formed.

Figure 3C:
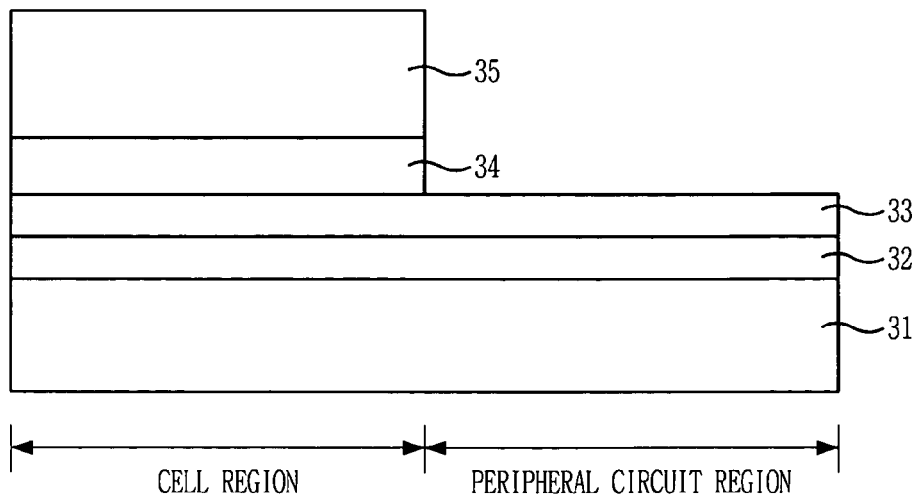

Referring to FIG. 3C, the second oxide layer 34 in the peripheral circuit region is removed by performing a first wet etching process along with use of the photosensitive pattern 35 as an etch barrier. For the first wet etching process, a chemical etchant such as hydrofluoric acid (HF) or buffered oxide etchant (BOE) is used. Herein, the BOE is obtained by mixing HF and ammonium fluoride ($NH_4F$) with the typical mixing ratio of approximately 1 to approximately 300, providing an oxide etch rate of approximately 15 Å per minute at a room temperature.

After the first wet etching process, in the cell region, there is formed a stack structure of the substrate 31, the first oxide layer 32, the nitride layer 33, the second oxide layer 34 and the photosensitive pattern 35. On the other hand, in the peripheral circuit region, there is formed a stack structure of the substrate 31, the first oxide layer 32 and the nitride layer 33.

Figure 3D:
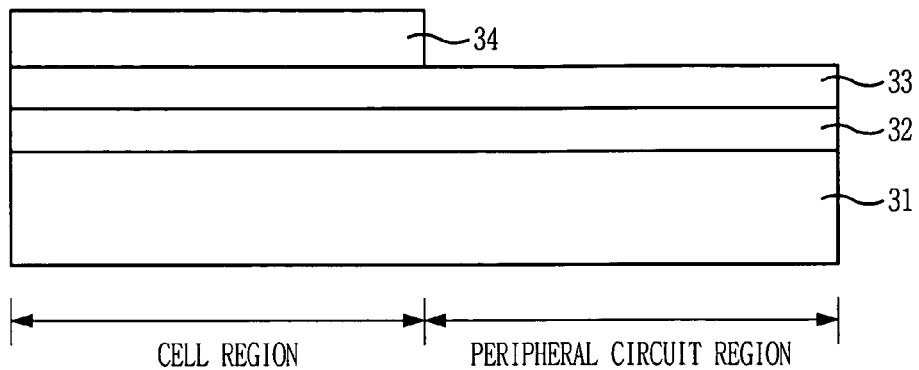

Referring to FIG. 3D, the photosensitive pattern 35 is removed. At this time, a portion of the second oxide layer 34 in the cell region can be possibly damaged during the removal of the photosensitive pattern 35.

Figure 3E:
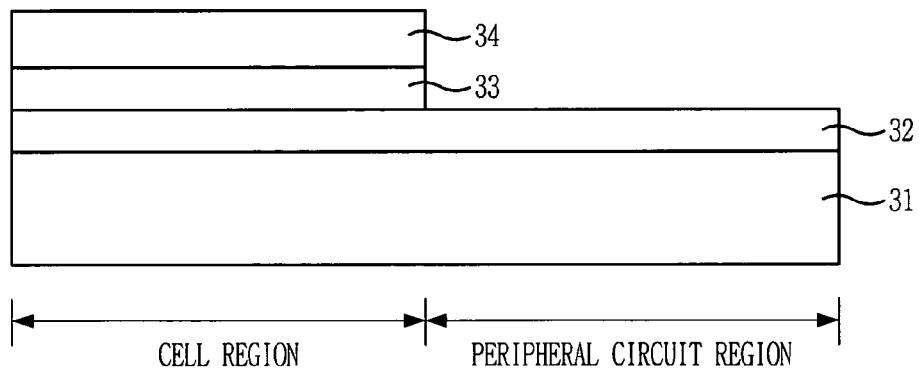

Referring to FIG. 3E, the nitride layer 33 in the peripheral circuit region is removed by performing a second wet etching process along with use of the second oxide layer 34 as an etch barrier. For the second wet etching process, a chemical etchant such as phosphoric acid ($H_3PO_4$) is used. Also, during the second wet etching process, the first oxide layer 32 in the peripheral circuit region can be possibly damaged.

After the second wet etching process, in the cell region, there is formed a stack structure of the substrate 31, the first oxide layer 32, the nitride layer 33, and the second nitride layer 34, while there is formed a stack structure of the substrate 31 and the first oxide layer 32 in the peripheral circuit region.

Figure 3F:
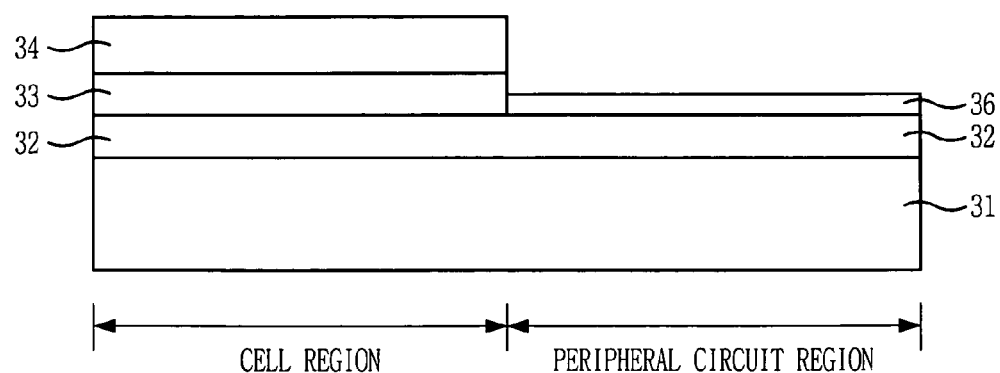
Figure 3G:
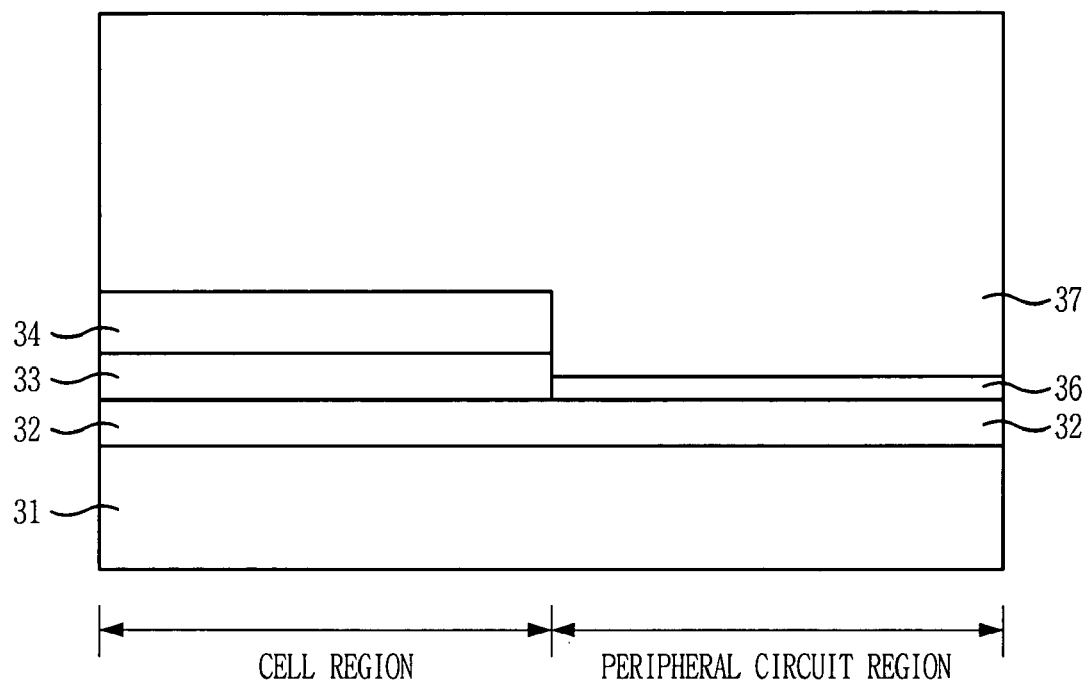

Referring to FIG. 3F, a thermal oxidation process is performed to form a thermal oxide layer 36 on the first oxide layer 32 in the peripheral circuit region. It should be noted that together the first oxide layer 32 and the thermal oxide layer 36 in the peripheral circuit region will be referred to as the third oxide layer hereinafter.

Thus, a total thickness of the third oxide layer is determined by adding a thickness of the first oxide layer 32 in the peripheral circuit region and a thickness of the thermal oxide layer 36 formed by the thermal oxidation process. More specifically, the total thickness of the third oxide layer ranges from approximately 35 Å to approximately 70 Å.

Meanwhile, during the thermal oxidation process, the second oxide layer 34 in the cell region becomes more densified and is partially oxidized.

As described above, there may be losses of each layer in the course of forming the dual gate dielectric structure. Thus, in order to obtain an intended thickness of each layer of the dual gate dielectric structure, the first oxide layer 32, the nitride layer 33 and the second oxide layer 34 should be formed with predetermined thicknesses in consideration of the lost or added thickness of those layers as shown in FIGS. 3D to 3F.

That is, as described in FIG. 3D, the second oxide layer 34 in the cell region may be partially lost during the removal of the photosensitive pattern 35. Also, as described in FIG. 3E, a portion of the first oxide layer 32 in the peripheral circuit region may be damaged during the second wet etching process. Also, as shown in FIG. 3F, there is an increment in the thickness of the first oxide layer 32 in the peripheral circuit region since the thermal oxide layer 36 is additionally formed on the first oxide layer 32 through the thermal oxidation process. In consideration of these loss and addition of the thickness, each layer should be formed with a carefully predetermined thickness in an initial stage of the formation.

Next, in the cell region and the peripheral circuit region, a gate polysilicon layer 37 is formed on the above described dual gate dielectric structure. Afterwards, a conventional series of processes are performed to form a gate electrode.

In accordance with the preferred embodiment of the present invention, the adopted wet etching process makes it possible to prevent damages to the dual gate dielectric structure usually occurring when a dry etching process is employed and degradation of reliability of the gate dielectric structure caused by a plasma used in a dry etching process.

The present application contains subject matter related to the Korean patent application No. KR 2003-0093887, filed in the Korean Patent Office on Dec. 19, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device with a dual gate dielectric structure applied to a non-volatile dynamic random access memory (NVDRAM), comprising the steps of:
    sequentially forming a first oxide layer, a nitride layer and a second oxide layer on a substrate provided with a cell region for the NVDRAM and a peripheral circuit region for a logic circuit;
    forming a mask on the cell region;
    performing a first wet etching process by using the mask as an etch barrier to remove the second oxide layer formed in the peripheral circuit region;
    performing a second wet etching process by using the second oxide layer remaining in the cell region as an etch barrier to remove the nitride layer formed in the peripheral circuit region;
    forming a third oxide layer on the first oxide layer remaining in the peripheral circuit region; and
    forming a gate electrode on the second oxide layer and the third oxide layer.

2. The method of claim 1, wherein the first oxide layer is formed by employing a thermal oxidation method.

3. The method of claim 1, wherein the first oxide layer has a thickness ranging from approximately 10 Å to approximately 30 Å.

4. The method of claim 1, wherein the nitride layer is made of silicon nitride ($Si_3N_4$) and has a thickness ranging from approximately 20 Å to approximately 50 Å.

5. The method of claim 1, wherein the second oxide layer is formed by employing a chemical vapor deposition (CVD) method.

6. The method of claim 1, wherein the second oxide layer has a thickness ranging from approximately 30 Å to approximately 50 Å.

7. The method of claim 1, wherein the step of performing the first wet etching process to remove the second oxide layer in the peripheral circuit region proceeds by using a chemical etchant of hydrofluoric acid (HF).

8. The method of claim 1, wherein the step of performing the first wet etching process to remove the second oxide layer in the peripheral circuit region proceeds by using a chemical etchant of buffer oxide etchant (BOE).

9. The method of claim 1, wherein the step of performing the second wet etching process to remove the nitride layer in the peripheral circuit region proceeds by using a chemical etchant of phosphoric acid ($H_3PO_4$).

10. The method of claim 1, wherein the step of forming the third oxide layer on the first oxide layer remaining in the peripheral circuit region proceeds by performing a thermal oxidation process.

11. The method of claim 10, wherein the first oxide layer and the third oxide layer formed in the peripheral circuit region have a total thickness ranging from approximately 35 Å to approximately 70 Å.

* * * * *